United States Patent
Jeon et al.

(10) Patent No.: US 9,496,163 B2
(45) Date of Patent: Nov. 15, 2016

(54) CARRIER AND METHOD OF FABRICATING SEMICONDUCTOR DEVICE USING THE SAME

(71) Applicant: Samsung Electronics Co., Ltd., Suwon-si (KR)

(72) Inventors: HyungJun Jeon, Seoul (KR); Byung Lyul Park, Seoul (KR); Jisoon Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/505,774

(22) Filed: Oct. 3, 2014

(65) Prior Publication Data
US 2015/0162235 A1 Jun. 11, 2015

(30) Foreign Application Priority Data
Dec. 5, 2013 (KR) .......................... 10-2013-0150777

(51) Int. Cl.
*H01L 23/495* (2006.01)
*H01L 21/683* (2006.01)
*H01L 21/304* (2006.01)
*H01L 21/768* (2006.01)

(52) U.S. Cl.
CPC ......... *H01L 21/6835* (2013.01); *H01L 21/304* (2013.01); *H01L 21/76898* (2013.01); *H01L 21/6836* (2013.01); *H01L 2221/6834* (2013.01); *H01L 2221/68327* (2013.01); *H01L 2924/0002* (2013.01)

(58) Field of Classification Search
USPC ................ 257/668, 618, 632, 432, E29.295, 257/E23.063, E21.505, 620
See application file for complete search history.

(56) References Cited

U.S. PATENT DOCUMENTS

| | | | |
|---|---|---|---|
| 7,919,394 B2 | 4/2011 | Nakamura et al. | |
| 7,994,025 B2 | 8/2011 | Sekiya | |
| 8,252,665 B2 | 8/2012 | Chiou et al. | |
| 8,252,682 B2 | 8/2012 | Yang et al. | |
| 8,596,623 B2 | 12/2013 | Frank et al. | |
| 2010/0248427 A1 | 9/2010 | Wu et al. | |
| 2010/0330788 A1 | 12/2010 | Yu et al. | |
| 2013/0011999 A1 | 1/2013 | Yun et al. | |
| 2013/0161795 A1* | 6/2013 | Owada | H01L 21/6835 257/620 |
| 2014/0004658 A1* | 1/2014 | Priewasser | H01L 21/56 438/118 |

FOREIGN PATENT DOCUMENTS

| | | | |
|---|---|---|---|
| JP | H09148283 A | 6/1997 | |
| JP | 2007073798 A | 3/2007 | |
| JP | 2013012654 A | 1/2013 | |
| KR | 1020090103261 A | 10/2009 | |
| KR | 1020100020778 A | 2/2010 | |

* cited by examiner

*Primary Examiner* — Timor Karimy
(74) *Attorney, Agent, or Firm* — Myers Bigel, P.A.

(57) ABSTRACT

Provided are a carrier and a method of fabricating a semiconductor device using the same. The carrier may include a recess region provided adjacent to an edge thereof. The recess region may be configured to confine an adhesive layer within a desired region including the recess region. The recess region makes it possible to reduce a process failure in a process of fabricating a semiconductor device.

20 Claims, 22 Drawing Sheets

CARRIER AND METHOD OF FABRICATING SEMICONDUCTOR DEVICE USING THE SAME

CROSS-REFERENCE TO RELATED APPLICATIONS

This U.S. non-provisional patent application claims priority under 35 U.S.C. §119 to Korean Patent Application No. 10-2013-0150777, filed on Dec. 5, 2013, the entire contents of which are hereby incorporated by reference herein.

BACKGROUND

As the electronic industry matures, there is an increasing demand for high-performance, high-speed and compact electronic systems. To meet such demand, it is necessary to provide a small and thin semiconductor chip. For example, a back-grinding process is used to thin a wafer. In the back-grinding process, a carrier is attached to the wafer using an adhesive layer to support the wafer.

SUMMARY

Example embodiments of the inventive concept relate to a carrier and a method of fabricating a semiconductor device using the same.

Example embodiments of the inventive concept provide a carrier capable of reducing facility error and/or particle contamination.

Other example embodiments of the inventive concept provide a method of reducing a process failure in a process of fabricating a semiconductor device.

According to example embodiments of the inventive concept, provided is a carrier for supporting a wafer using an adhesive layer interposed therebetween. The carrier may include an edge portion and at least one recess region formed in a top surface of the carrier at the edge portion.

In example embodiments, the at least one recess region may include a circle-shaped region extending continuously along the edge portion. A width of the at least one recess region may vary along a length or path of the at least one recess region.

In other example embodiments, the at least one recess region may include a plurality of concentric circle-shaped regions extending continuously along the edge portion.

In example embodiments, the at least one recess region may include a plurality of depressions formed in the top surface of the carrier that are spaced apart from each other. Each of the plurality of depressions may be shaped like one of characters '+', 'T', 'I' or a quadrangle, when viewed from above the top surface of the carrier. The depressions may be arranged in a ring shape in the top surface of the carrier.

In example embodiments, the at least one recess region may have an uneven bottom surface.

In example embodiments, the carrier may have a wafer shape, when viewed in a top view. Further, the carrier may be substantially transparent.

In example embodiments, the carrier may further include a mask pattern provided on the top surface thereof. A sidewall of the mask pattern may be aligned with a sidewall of the at least one recess region.

In example embodiments, the at least one recess region may be provided spaced apart from an outermost edge of the carrier.

In example embodiments, the at least one recess region may include a circle-shaped recess that extends continuously around the edge portion. A plurality of spaced apart projections may be in the recess.

According to example embodiments of the inventive concept, a method of fabricating a semiconductor device may include providing a carrier comprising an edge portion and at least one recess region formed in a top surface of the carrier at the edge portion, attaching the carrier to a wafer using an adhesive layer between the top surface of the carrier and the wafer, and performing a grinding process to remove a portion of the wafer.

In example embodiments, the attaching of the carrier to the wafer may include forming the adhesive layer to fill the at least one recess region.

In example embodiments, the wafer may include a device region and an edge region that has a different thickness or height than the device region, and the at least one recess region may be aligned with or overlapped with a boundary between the device and edge regions when the carrier is attached to the wafer.

In example embodiments, when viewed in a top view, a width of the edge region in contact with the adhesive layer may be smaller than a width of the at least one recess region overlapped with the edge region.

In example embodiments, the wafer may include a through via, and the grinding process may be performed to expose a bottom surface of the through via.

In example embodiments, the method may further include forming a conductive pad to be in contact with the bottom surface of the through via.

According to example embodiments of the inventive concept, provided is a carrier for supporting a wafer using an adhesive layer interposed therebetween. The carrier includes an edge portion and a recess formed in a top surface of the carrier at the edge portion, with the recess extending continuously around the edge region.

In example embodiments, the carrier is in combination with the wafer that is attached to the carrier by the adhesive layer between the top surface of the carrier and the wafer. Adhesive from the adhesive layer may substantially fill the recess.

In example embodiments, the wafer includes a device region and an edge region that has a thickness that is less than a thickness of the device region, and a boundary between the device region and the edge region overlies the recess with the carrier and the wafer in a horizontal position. The boundary may be spaced apart horizontally from an outer sidewall of the recess by a first horizontal distance, and the adhesive layer may be in contact with the edge region of the wafer a second horizontal distance that is less than the first horizontal distance.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
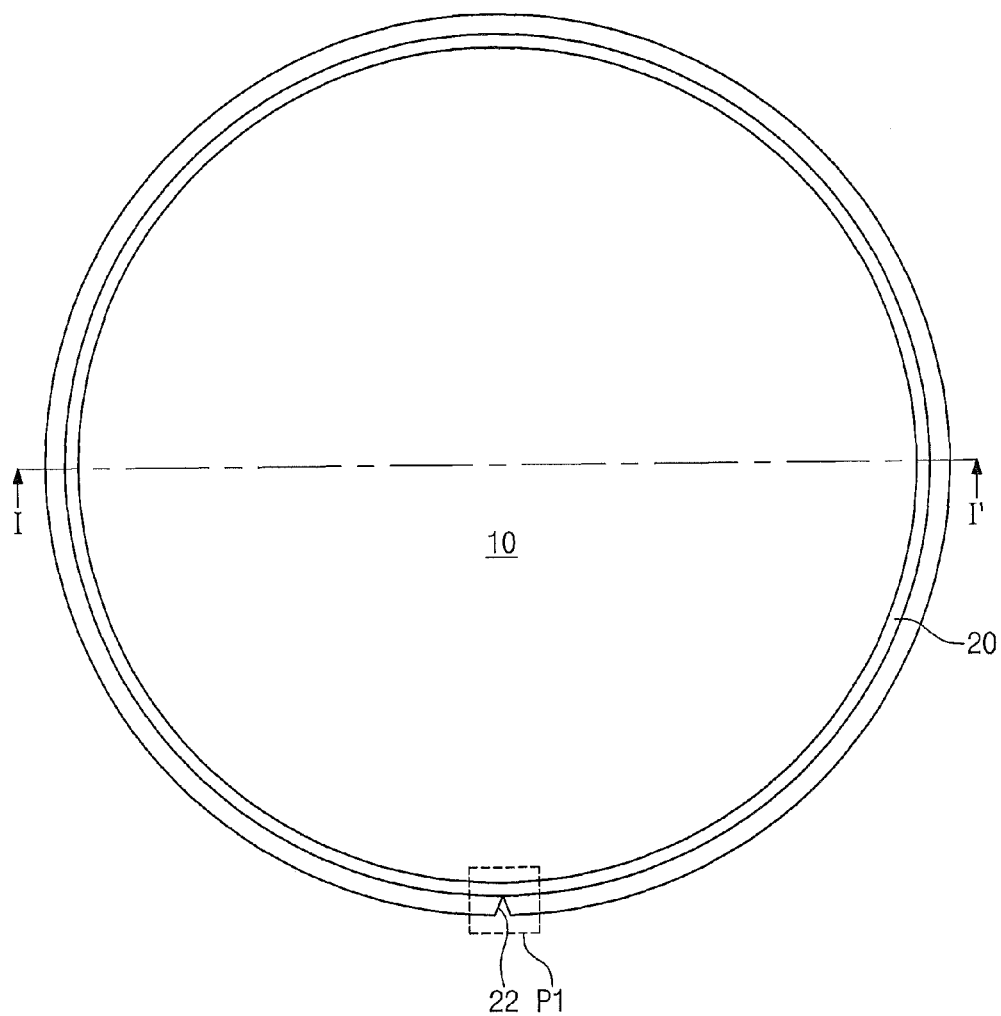
FIG. 1 is a plan view illustrating a carrier according to example embodiments of the inventive concept.

It should be noted that these figures are intended to illustrate the general characteristics of methods, structure and/or materials utilized in certain example embodiments and to supplement the written description provided below.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
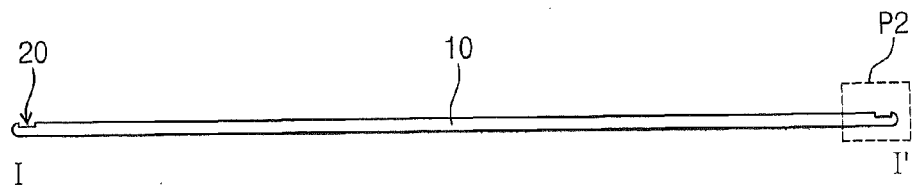
FIG. 2 is a sectional view taken along a line I-I' of FIG. 1.
Figure 3A:
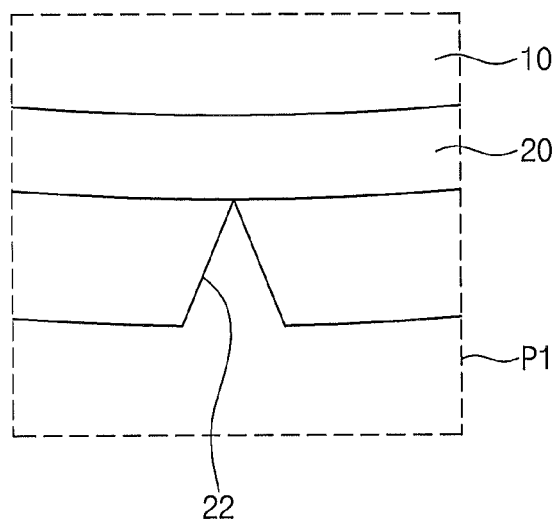
FIGS. 3A and 3B are enlarged views of a portion 'P1' of FIG. 1.
Figure 3B:
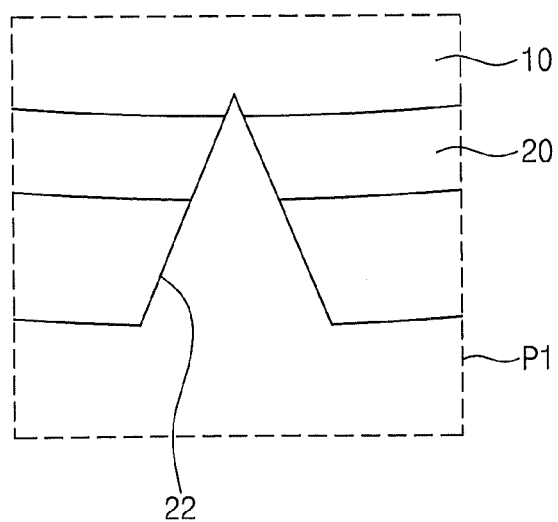

FIG. 1 is a plan view illustrating a carrier according to example embodiments of the inventive concept. FIG. 2 is a sectional view taken along a line I-I' of FIG. 1, and FIGS. 3A and 3B are enlarged views of a portion 'P1' of FIG. 1. FIGS. 4A through 4D are sectional views enlarging a portion 'P2' of FIG. 2 according to example embodiments of the inventive concept.

Referring to FIGS. 1, 2, 3A, 3B, and 4A through 4D, a carrier 10 may be attached to a wafer to support the wafer in a process of processing the wafer (for example, a grinding process). The carrier 10 may be shaped like a wafer. The carrier 10 may be formed of or include a substantially transparent material (e.g., glass). The carrier 10 may include a recess or recess region 20 formed adjacent to an edge of the carrier 10. The recess 20 may be formed at an edge portion of the carrier 10. The recess or recess region 20 may also be called a groove or a groove region. The carrier 10 may include a notch or notch region 22 indicating an orientation or position of the carrier 10. The recess region 20 may not be cut by the notch region 22 as shown in FIG. 3A. Alternatively, the recess region 20 may be cut by the notch region 22 as shown in FIG. 3B. In the present example, the recess region 20 may be shaped like a circle or an arc, when viewed in a top view. In other words, the recess or recess region 20 may be circular in shape on a top or upper surface of the carrier 10. Other shapes for the recess or recess region 20 are contemplated. For example, the recess or recess region 20 may be elliptical, rectangular or square in shape on the top or upper surface of the carrier 10. The recess or recess region 20 may extend around an outer periphery portion of the carrier 10, as shown.

Figure 4A:
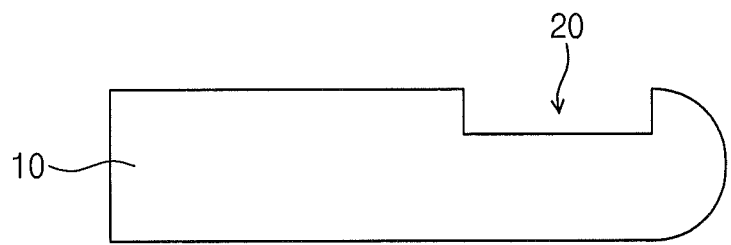
FIGS. 4A through 4D are sectional views enlarging a portion 'P2' of FIG. 2 according to example embodiments of the inventive concept.
Figure 4B:
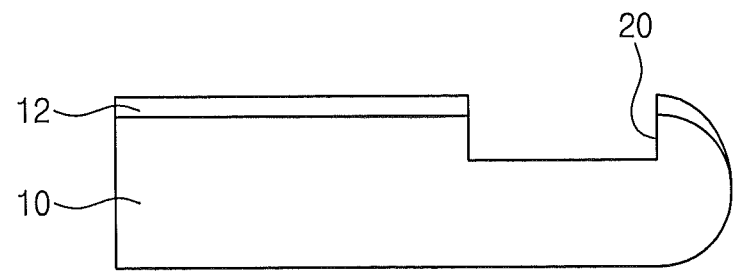
Figure 4C:
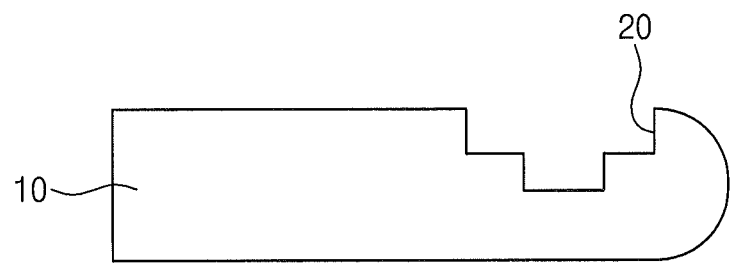
Figure 4D:
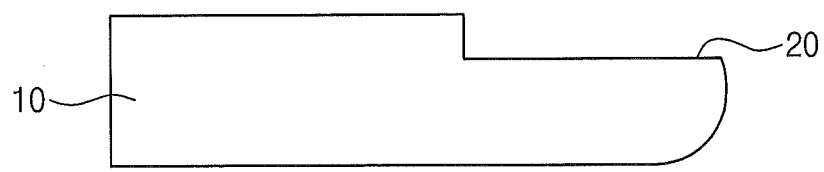

As shown in FIG. 4B, a mask pattern 12, which was used to form the recess region 20, may remain on the carrier 10. The mask pattern 12 may be formed of a material such as photosensitive polyimide (PSPI), silicon oxide, silicon nitride, or silicon oxynitride. A sidewall of the mask pattern 12 may be aligned with a sidewall of the recess region 20. The recess region 20 may have a flat bottom surface. Alternatively, as shown in FIG. 4C, the recess region 20 may have an uneven bottom surface (e.g., a stepped bottom surface). As another example, as shown in FIG. 4D, the recess region 20 may extend to the outermost edge of the carrier 10. Example embodiments of the inventive concept will not be limited to the afore-described examples, and the section of the edge portion of the carrier 10 may be changed in various ways as will be understood by those skilled in the art.

A plan shape of the recess region 20 (e.g., the shape of the recess or recess region 20 on the top or upper surface of the carrier 10) may also be changed in various ways as will be understood by those skilled in the art, including in the ways discussed above.

FIGS. 5A through 5F are plan views illustrating carriers according to other example embodiments of the inventive concept. FIGS. 6A through 6E are plan views illustrating recess regions of carriers according to still other example embodiments of the inventive concept.

Figure 5A:
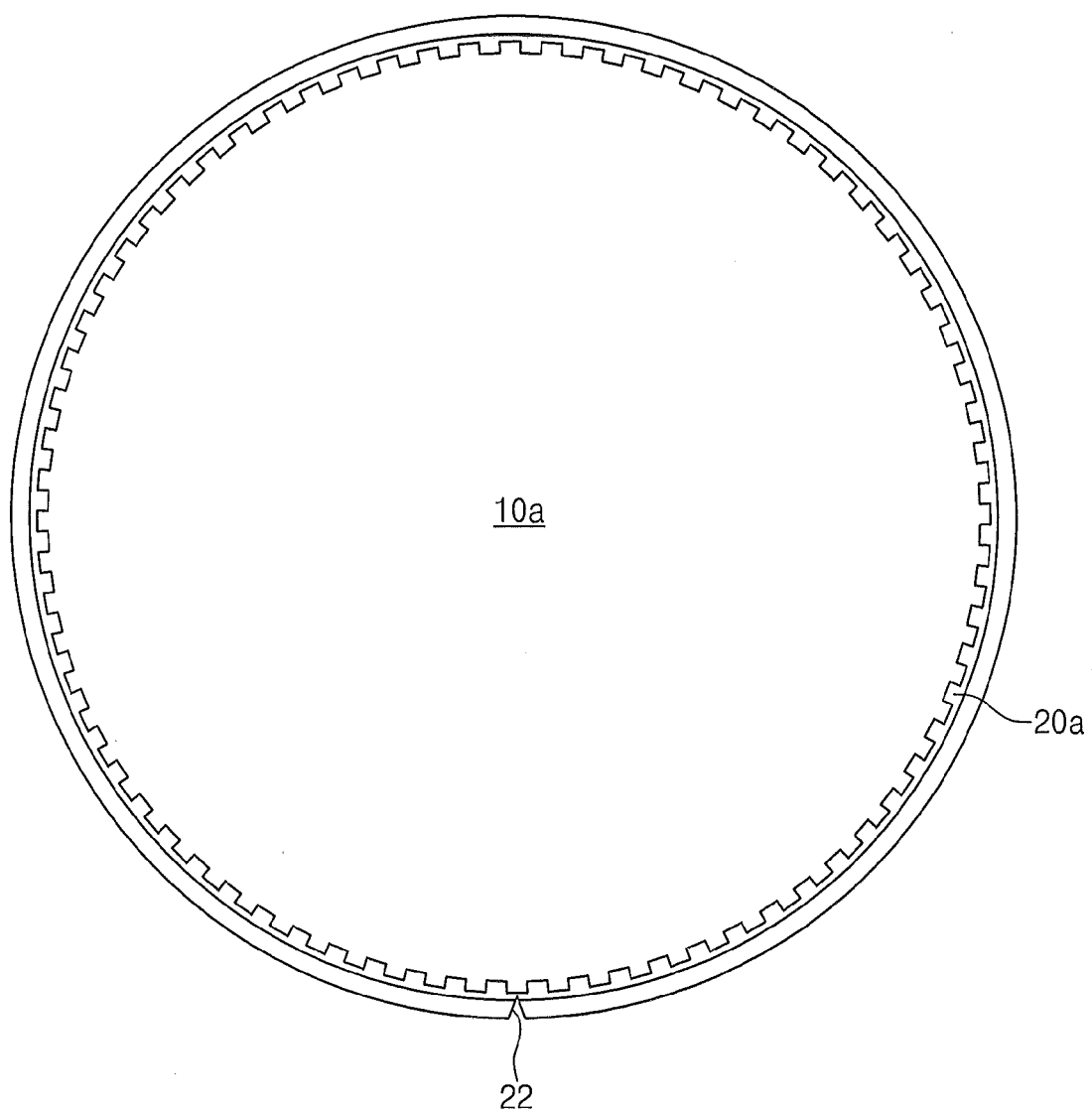
FIGS. 5A through 5F are plan views illustrating carriers according to other example embodiments of the inventive concept.

Referring to FIG. 5A, according to the present example, a carrier 10a may include a recess or recess region 20a, which is shaped like a circle or an arc and has an uneven (e.g., saw-toothed or jagged) inner sidewall, when viewed in a top view (e.g., when viewed from above the upper surface of the carrier 10a). For example, a width of the recess region 20a may vary depending on position thereof. In other words, the recess or recess region 20a may vary in width along the length or path of the recess or recess region 20a as it extends around the carrier 10a.

Figure 5B:
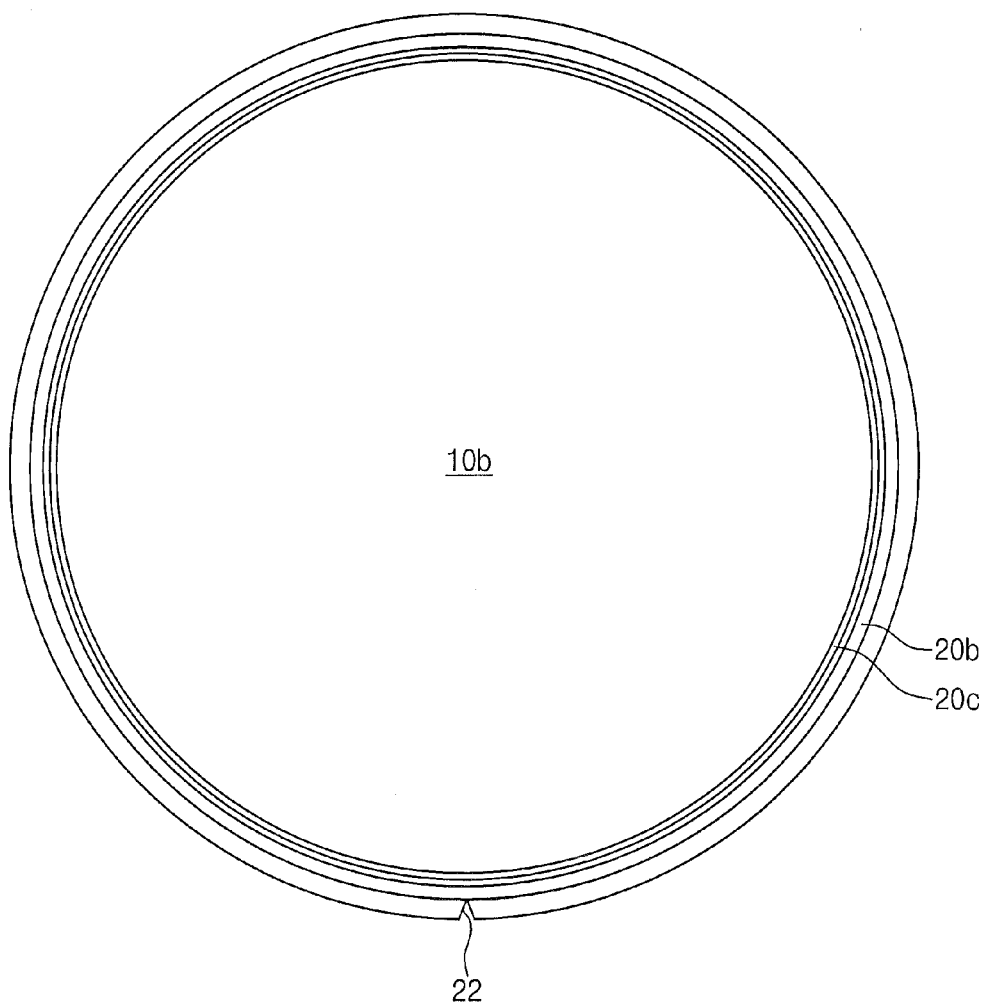

In other embodiments, as shown in FIG. 5B, a carrier 10b may include recesses or recess regions 20b and 20c, which are shaped like a circle or an arc, when viewed in a top view, and whose widths are different from each other.

Figure 5C:
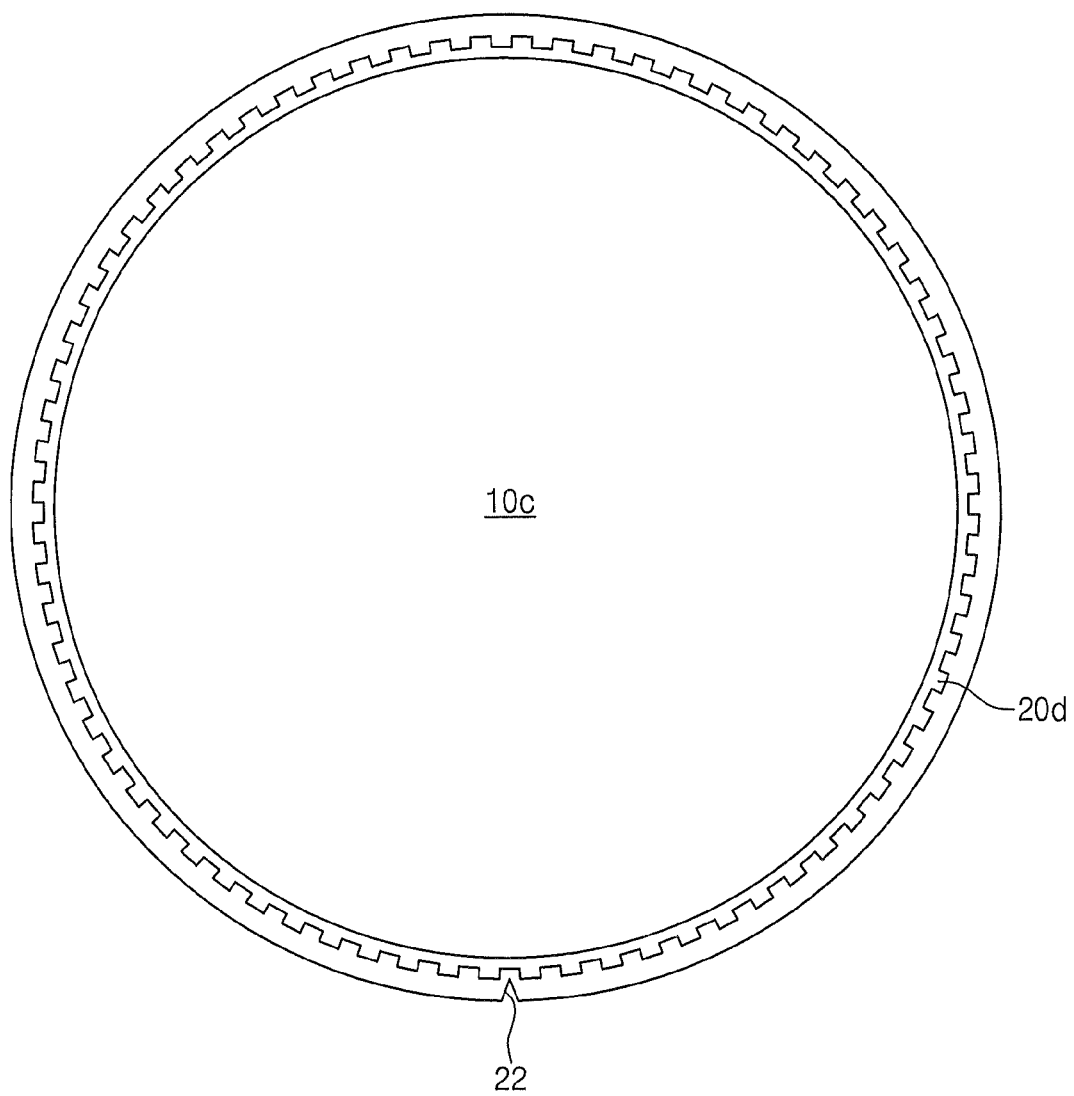

In still other embodiments, as shown in FIG. 5C, a carrier 10c may include a recess or recess region 20d, which is shaped like a circle or an arc and has an uneven (e.g., saw-toothed or jagged) outer sidewall, when viewed in a top view. For example, a width of the recess region 20d may vary depending on position thereof. In other words, the recess or recess region 20d may vary in width along the length or path of the recess or recess region 20d as it extends around the carrier 10c.

Figure 5D:
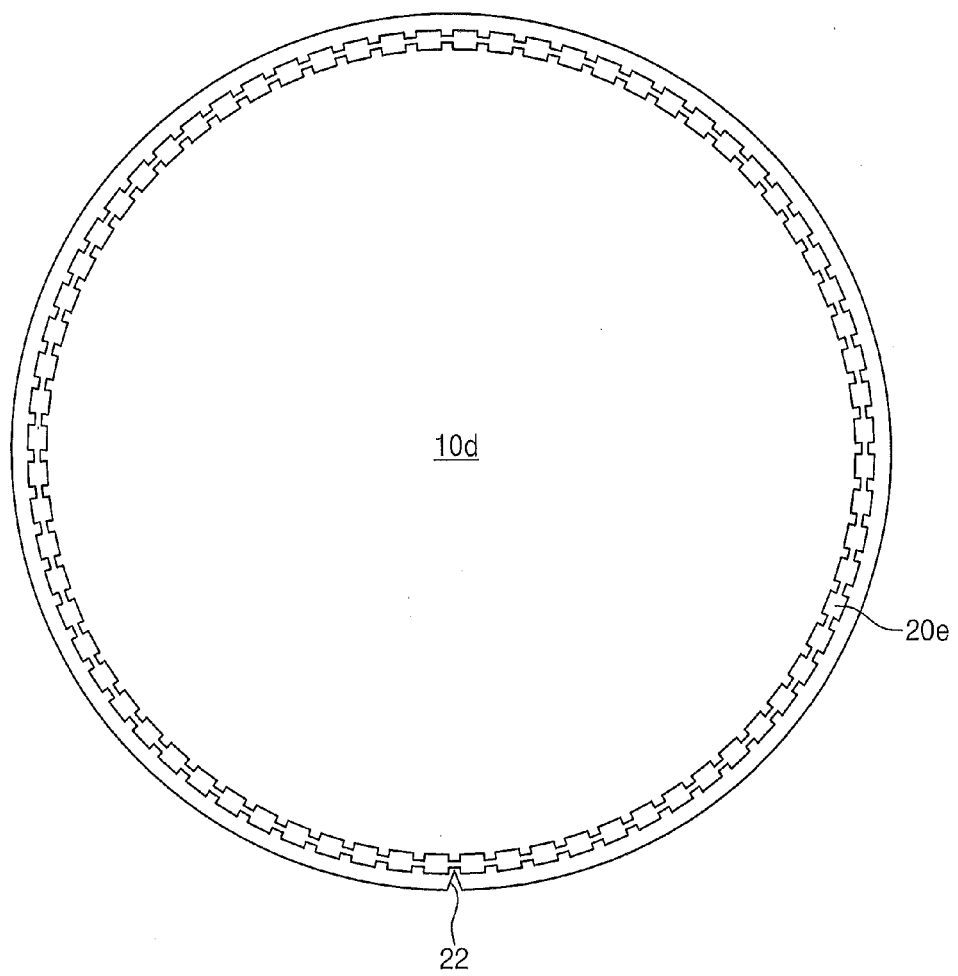

In even other embodiments, as shown in FIG. 5D, a carrier 10d may include a recess or recess region 20e, which is shaped like a circle or an arc and has uneven (e.g., saw-toothed or jagged) inner and outer sidewalls, when viewed in a top view. For example, a width of the recess region 20e may vary depending on position thereof. In other words, the recess or recess region 20e may vary in width along the length or path of the recess or recess region 20e as it extends around the carrier 10d.

Figure 5E:
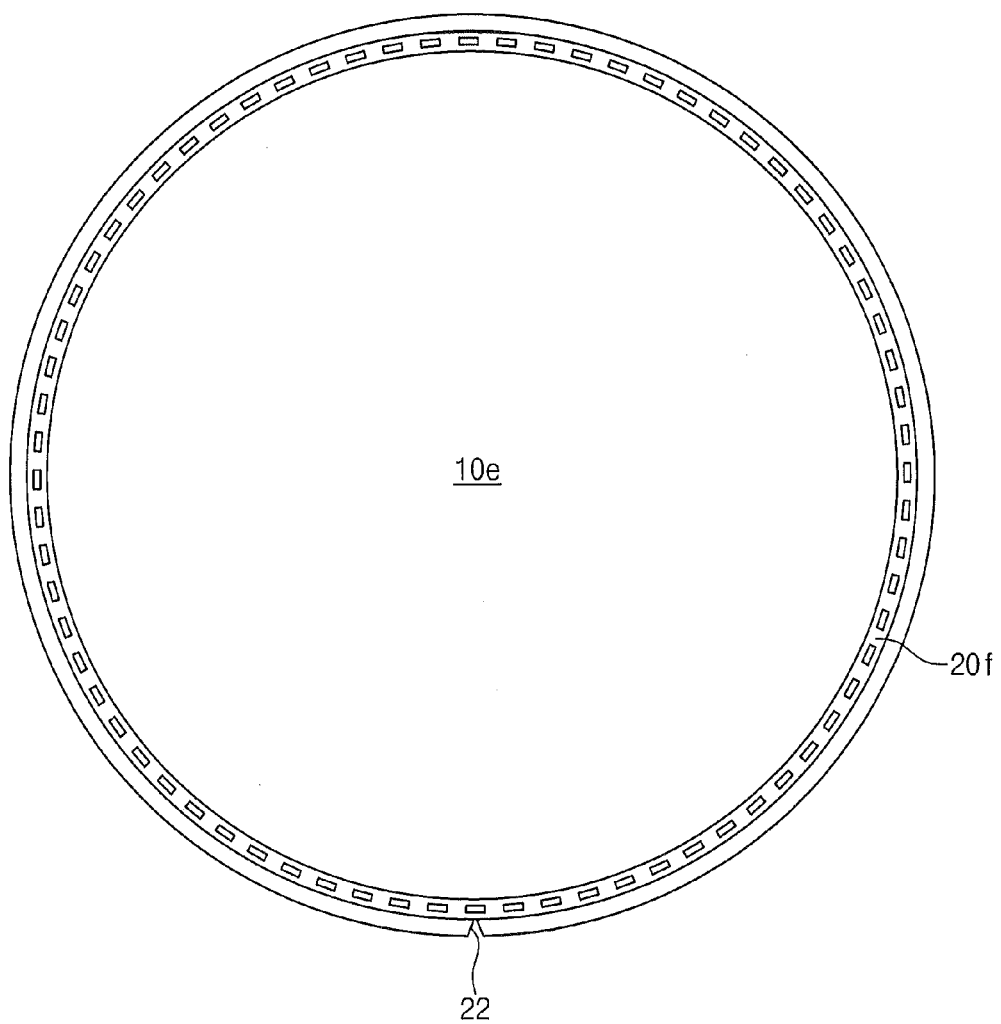

In yet other embodiments, as shown in FIG. 5E, a carrier 10e may include a recess or recess region 20f, which is shaped like a circle or an arc, when viewed in a top view. The recess region 20f may include at least a portion shaped like a ladder or a railroad track. For example, there may be a plurality of spaced apart projections in the recess or recess region 20f and extending from a bottom surface of the recess or recess region 20f.

Figure 5F:
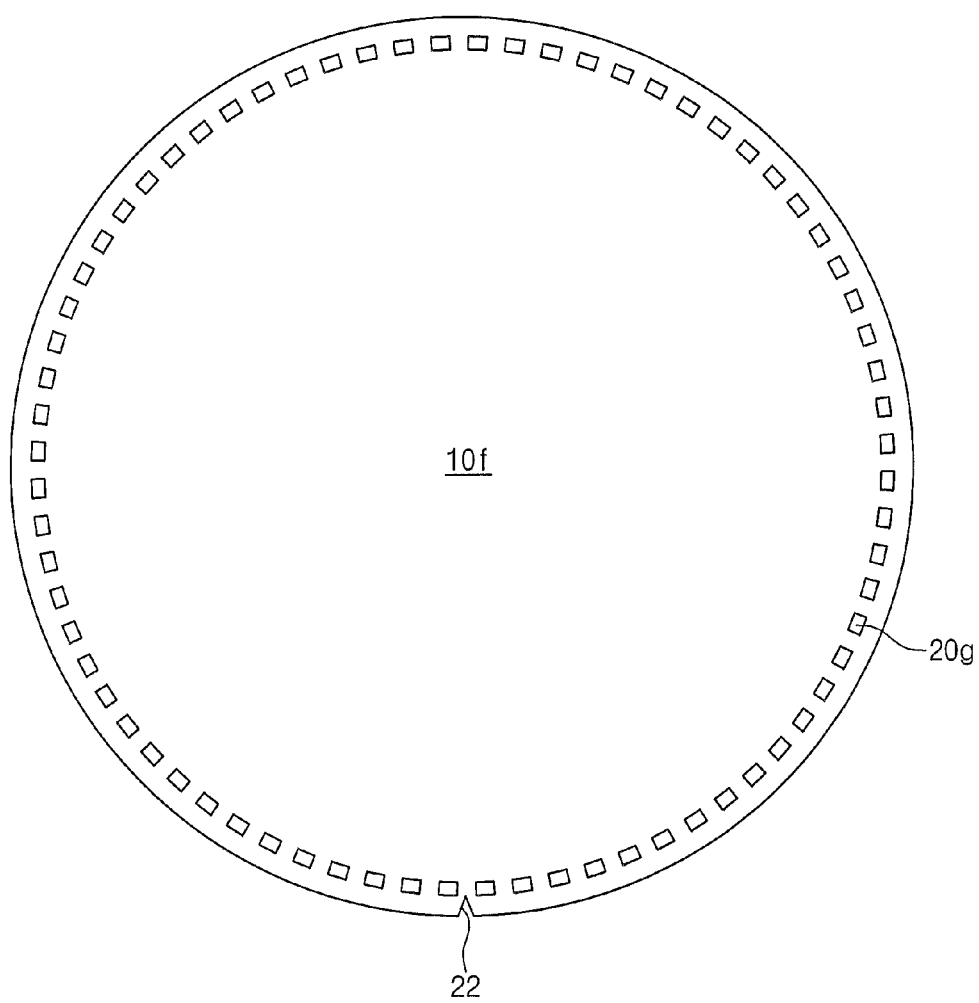
Figure 6A:
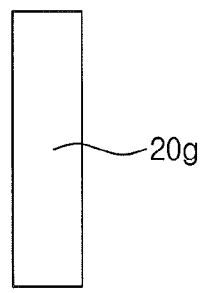
FIGS. 6A through 6E are plan views illustrating recess regions of carriers according to still other example embodiments of the inventive concept.
Figure 6B:
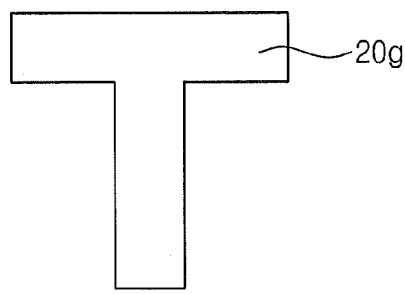
Figure 6C:
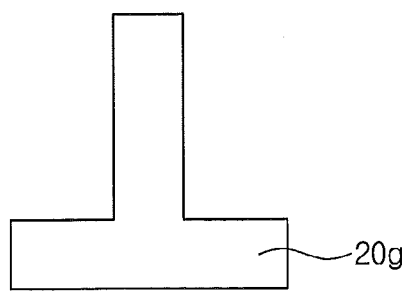
Figure 6D:
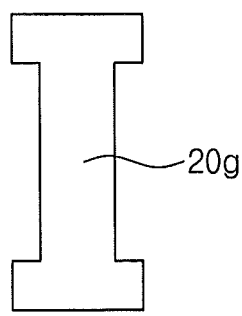
Figure 6E:
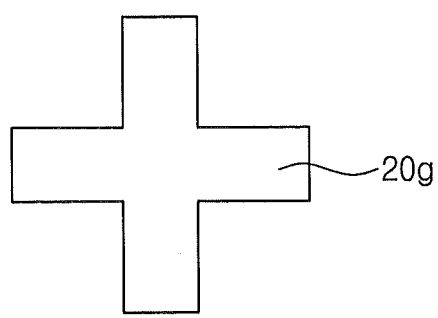

In further embodiments, as shown in FIGS. 5F and 6A through 6E, a carrier 10f may include recesses or recess regions 20g, which are spaced apart from each other, and each of which is shaped like an island. The recesses or recess regions 20g may be in the form of depressions in the top or upper surface of the carrier 10f. The recesses or recess regions 20g may be arranged in a ring shape in or on the top surface of the carrier, as shown in FIG. 5F. The recess region 20g may be shaped like a rectangle shown in FIG. 6A, like a letter 'T' shown in FIG. 6B, like an inverted letter 'T' shown in FIG. 6C, like a letter 'I' shown in FIG. 6D, or like a plus symbol '+' shown in FIG. 6E, but example embodiments of the inventive concept may not be limited thereto. For example, a planar shape of the recess region 20g may be changed in various ways as will be understood by those skilled in the art.

A process of fabricating the carrier 10 will be described with reference to FIGS. 7A and 7B. To provide better understanding of example embodiments of the inventive concept, the carrier 10 in FIGS. 7A and 7B is illustrated with exaggerated structure and thickness, compared with that illustrated in FIG. 2.

Figure 7A:
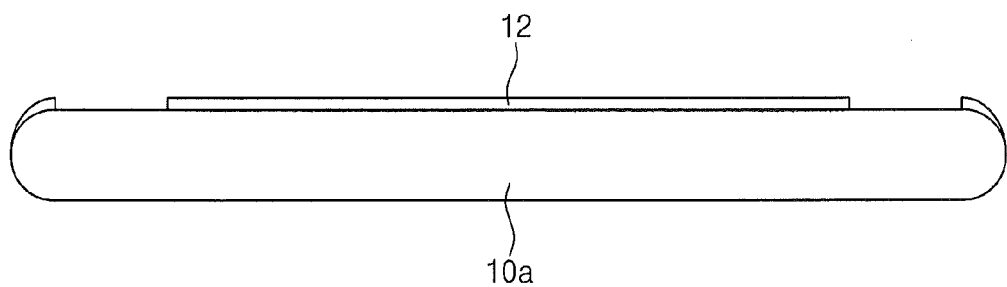
FIGS. 7A and 7B are sectional views illustrating a process of fabricating a carrier, according to example embodiments of the inventive concept.

Referring to FIG. 7A, a mask pattern 12 may be formed on a carrier substrate 10a to have an opening partially exposing the carrier substrate 10a adjacent to an edge portion thereof. The mask pattern 12 may be formed of a material (e.g., a photosensitive polyimide (PSPI), silicon oxide, silicon nitride, or silicon oxynitride) having an etch selectivity with respect to the carrier substrate 10a.

Figure 7B:
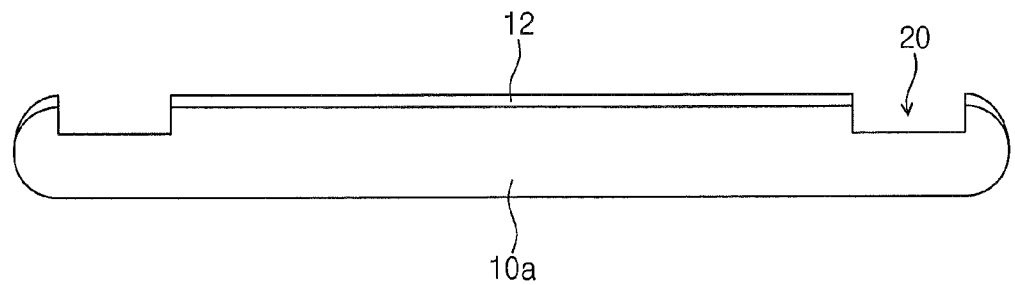

Referring to FIG. 7B, the exposed portion of the carrier substrate 10a may be patterned using the mask pattern 12 as an etch mask. Accordingly, the carrier 10 may be formed to have the recess or recess region 20 adjacent to or around the edge portion. The mask pattern 12 may be removed to expose the top surface of the carrier 10. In certain embodiments, the mask pattern 12 may not be removed and remain on the carrier 10.

Alternatively, the recess region 20 of the carrier 10 may be formed using laser grooving or a blade, without the use of the mask pattern 12.

The recess region 20 or 20a-20g may be configured to confine an adhesive layer 40 within a desired region in a subsequent process. Owing to the presence of such a recess region 20 or 20a-20g, overflow of the adhesive layer 40 can be controlled. Further, by forming the recess region 20 or 20a-20g in the carrier 10, it is possible to suppress or prevent an issue of microvoid or edge glue from occurring. As a result, a problem of particle contamination can be reduced in a subsequent process, and this makes it possible to suppress process failure from occurring in manufacturing facilities. Accordingly, it is possible to perform steps of outgassing and airvent with ease, and thus, a carrier-to-wafer bonding can be stably executed. The carrier 10 may be recycled, and thus, cost of fabrication process can be reduced.

Next, a method of processing a wafer using the carrier 10 to fabricate a semiconductor device or a semiconductor package will be exemplarily described with reference to the accompanying drawings.

Figure 8A:
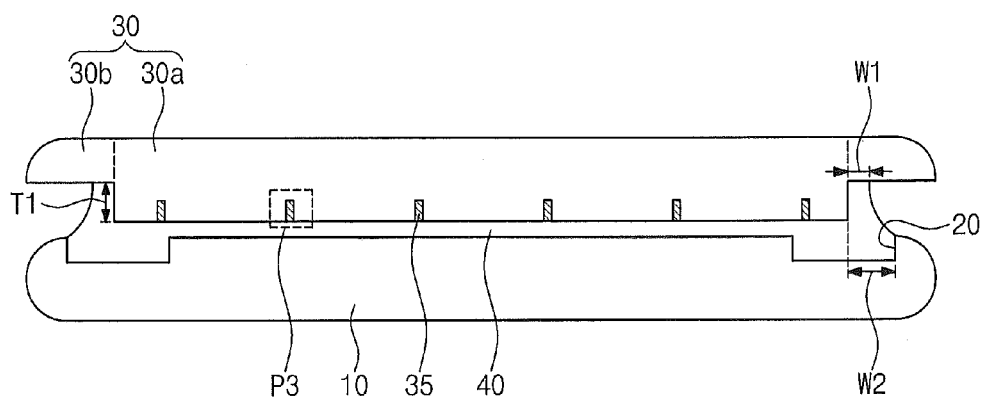
FIGS. 8A through 8G are sectional views illustrating a process of fabricating a semiconductor package, according to example embodiments of the inventive concept.

FIGS. 8A through 8G are sectional views illustrating a process of fabricating a semiconductor package, according to example embodiments of the inventive concept. FIG. 9A is a sectional view enlarging a portion 'P3' of FIG. 8A, and FIGS. 9B and 9C are sectional views enlarging a portion 'P3' of FIG. 8C.

Referring to FIG. 8A, a wafer 30 may be attached on or to the carrier 10 by an adhesive layer 40 interposed therebetween. Although not shown, the adhesive layer 40 may include a release layer and a glue layer. The release layer and the glue layer may be formed of or include at least one of thermoplastic resins, thermosetting resins, or photo-curable resins. The wafer 30 may include a device region 30a and an edge region 30b. The device region 30a may be divided into a plurality of pieces, which will be used as semiconductor chips, in a subsequent sawing process. The device region 30a may be configured to include a portion P3 shown in FIG. 9A.

Referring to FIG. 9A, transistors TR may be formed on the device region 30a of the wafer 30. The transistors TR may be covered with interlayered insulating layers 34. Interconnection lines 33 may be provided between the interlayered insulating layers 34. A through via 35 may be formed to penetrate a first one of the interlayered insulating layer 34 and a portion of the device region 30a and be in contact with a first interconnection line 33. The through via 35 may be formed of a metallic material (e.g., copper). A diffusion barrier layer 32 and an insulating layer 31 may be conformally interposed between the through via 35 and the device region 30a and between the through via 35 and the interlayered insulating layer 34. A first conductive pad 36 may be provided on the uppermost layer of the interlayered insulating layers 34. A portion of the conductive pad 36 and the outermost or uppermost layer of the interlayered insulating layers 34 may be covered with a first passivation layer 37. Thereafter, a conductive bump 38 may be formed to penetrate the first passivation layer 37 and be in contact with the first conductive pad 36.

Referring back to FIG. 8A, the edge region 30b may be formed to have a different height or thickness than the device region 30a. For example, the device region 30a may protrude from the edge region 30b by a first distance or thickness T1. The edge region 30b may include a bevel region or a slanted side surface. When viewed in a top view, the edge region 30b and the device region 30a may be formed in such a way that a boundary therebetween is located on or overlapped with the recess region 20. Put another way, the boundary between the edge region 30b and the device region 30a may be aligned with the recess or recess region 20 when the carrier 10 and the wafer 30 are attached. The adhesive layer 40 may fill the recess region 20. Due to the recess region 20 of the carrier 10, a contact area between the adhesive layer 40 and the edge region 30b can be reduced. For example, a first distance (e.g., first horizontal distance) or width W1 of a bottom surface of the edge region 30b in contact with the adhesive layer 40 may be smaller than a second distance (e.g., second horizontal distance) or width W2 of a bottom surface of the recess region 20 that is overlapped with the edge region 30b. The adhesive layer 40 may be formed to have a slanted side surface at an angle or may have a curved side surface. By virtue of the presence of the recess region 20, the adhesive layer 40 may be prevented from overflowing toward side and bottom surfaces of the carrier 10. The recess region 20 may be continuously formed around the edge region 30b. For example, the recess region 20 may be formed to have an arc or circle shape or other shape that extends around an outer edge or periphery portion of the carrier 10.

Figure 8B:
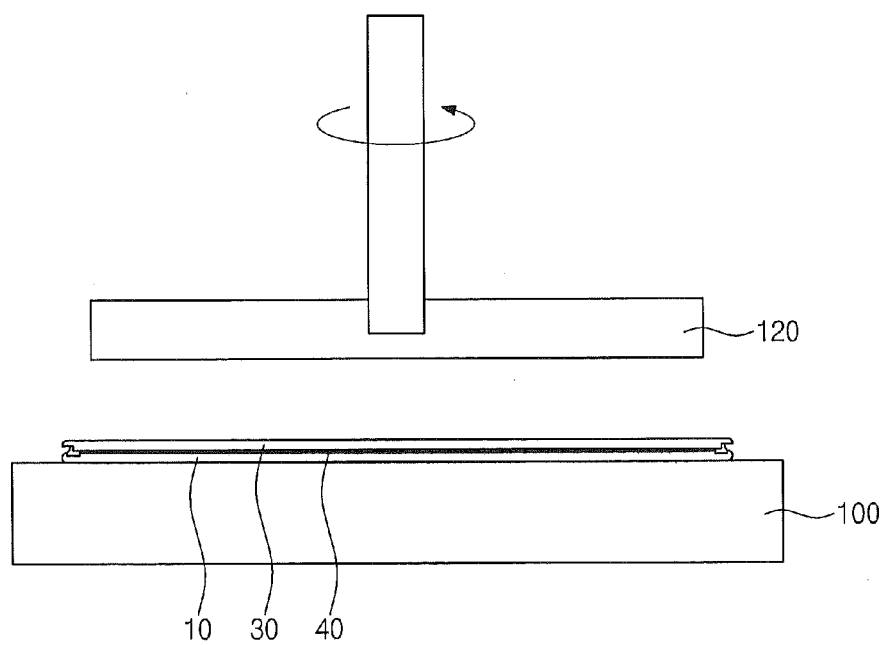
Figure 9A:
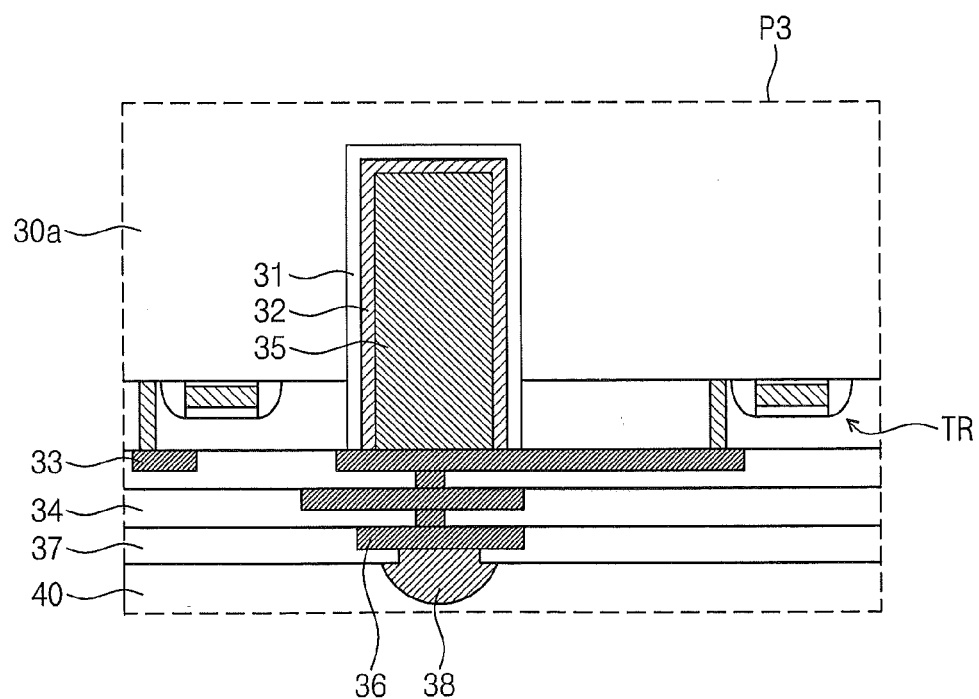
FIG. 9A is a sectional view enlarging a portion 'P3' of FIG. 8A.
Figure 9B:
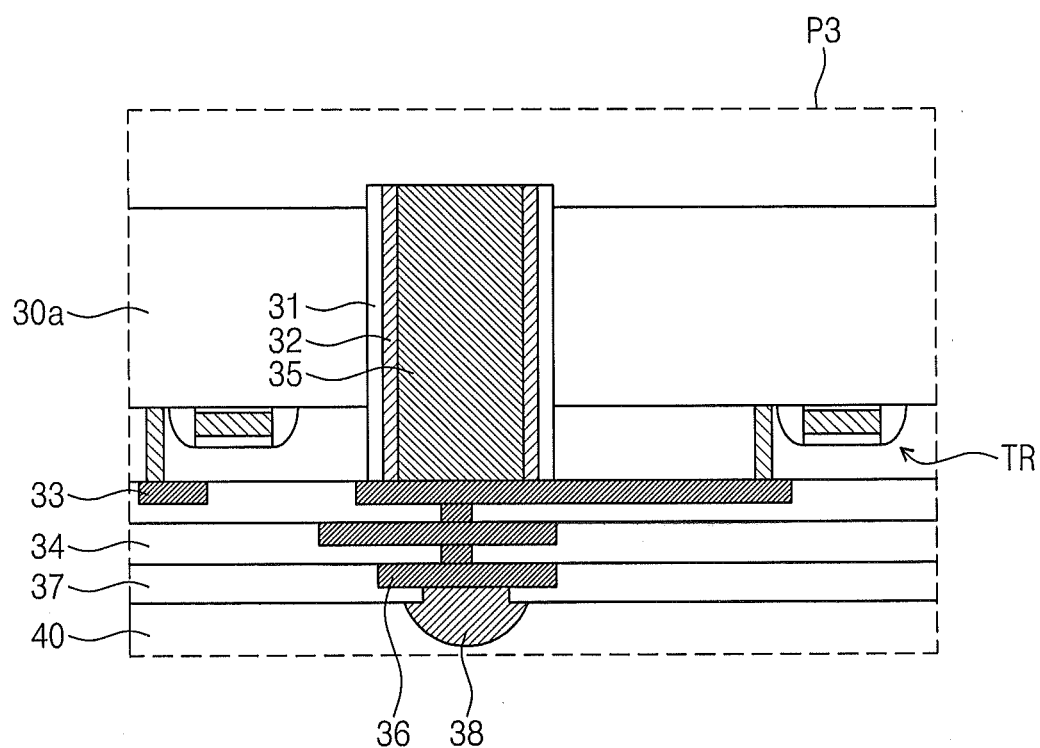
FIGS. 9B and 9C are sectional views enlarging a portion 'P3' of FIG. 8C.
Figure 9C:
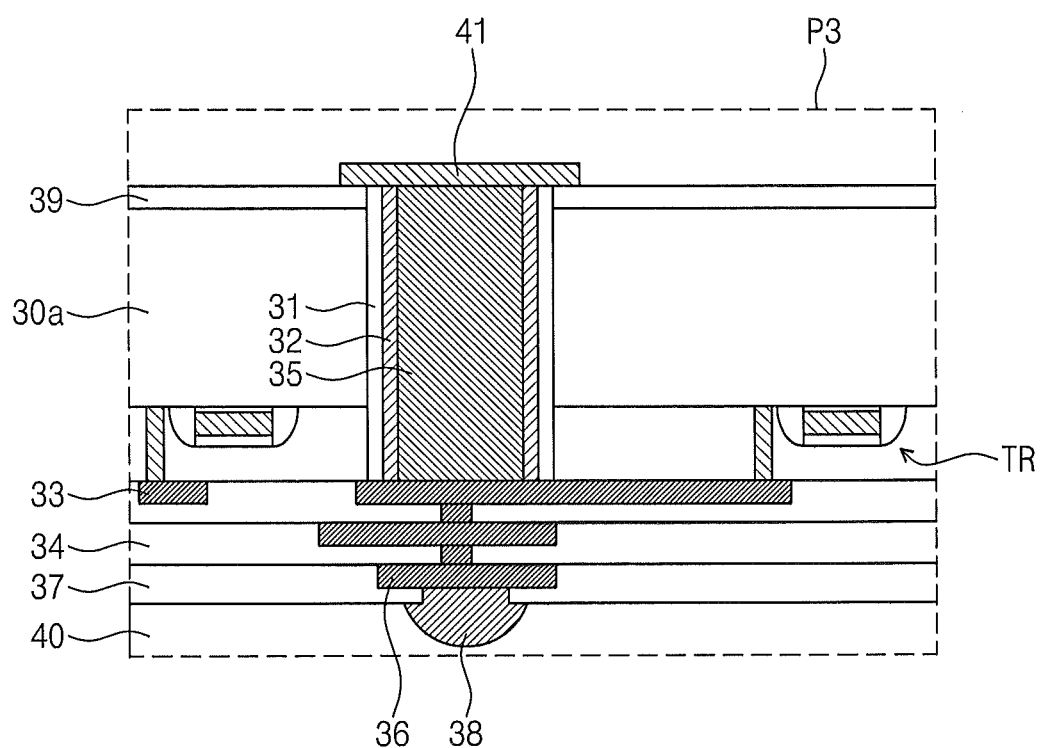

Referring to FIG. 8B, the carrier 10 attached with the wafer 30 may be loaded in a back-grinding facility. The carrier 10 may be loaded on a chuck 100 of the back-grinding facility. The chuck 100 may be, for example, a vacuum chuck. Since the adhesive layer 40 may be prevented from overflowing toward the bottom surface of the carrier 10 by the recess region 20, the bottom surface of the carrier 10 may be in close contact with the top surface of the chuck 100. That is, a chuck error can be prevented from occurring. A grinding wheel 120 may be disposed over the chuck 100. The grinding wheel 120 may be configured to be rotated relative to the chuck 100. The grinding wheel 120 may have a diameter that is equivalent to, larger or smaller than that of the wafer 30.

Figure 8C:
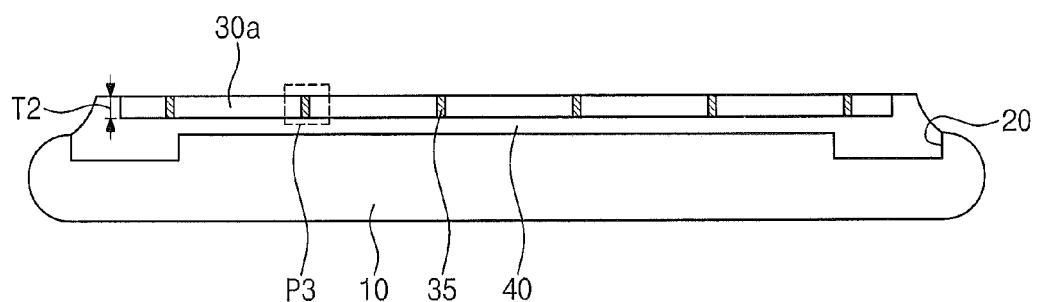

Referring to FIG. 8C, a back-grinding process may be performed to the wafer 30 in such a way that the device region 30a has a second thickness T2 that is smaller than the first thickness T1. During the back-grinding process, the edge region 30b may be removed to expose the adhesive layer 40 on the recess region 20. Since an amount of the adhesive layer 40 on the sidewall of the device region 30a is reduced by the presence of the recess region 20, it is possible to reduce particles produced from the adhesive layer 40. Accordingly, it is possible to suppress the manufacturing facility from being contaminated by the particles.

Referring to FIG. 9B, the back-grinding process may be performed to expose a bottom surface of the through via 35. The carrier 10 may be unloaded from the back-grinding facility, and then, the device region 30a may be partially etched-back to partially expose a sidewall of the insulating layer 31.

Referring to FIG. 9C, a second passivation layer 39 may be formed on a back side of the device region 30a. Thereafter, a second conductive pad 41 may be formed to be in contact with the through via 35. Although not shown, a redistribution layer may be further formed to be in contact with the second conductive pad 41.

Figure 8D:
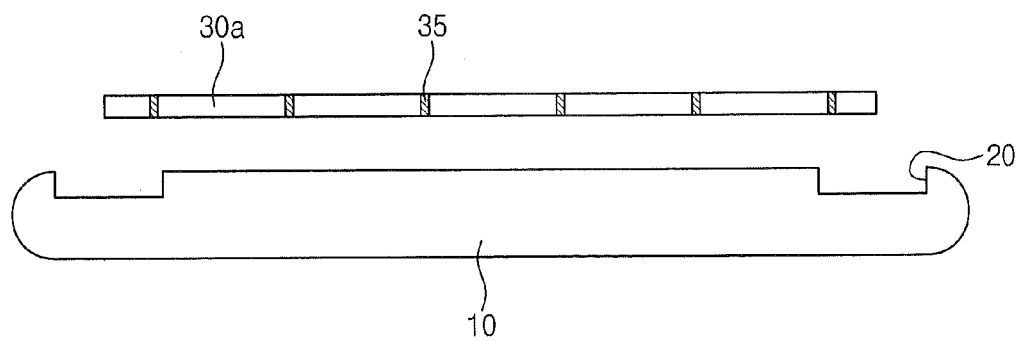

Referring to FIG. 8D, the wafer 30a may be detached from the carrier 10. For example, the detaching of the wafer 30a may be performed by applying heat or light to the adhesive layer 40. Alternatively, the wafer 30a may be detached by applying a physical force to the adhesive layer 40. The carrier 10 detached from the wafer 30a may be recycled.

Figure 8E:
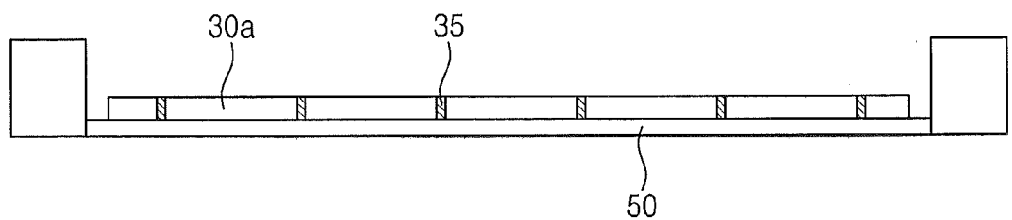

Referring to FIG. 8E, the wafer 30a may be loaded on a chip-attaching tape 50, which may be provided in a die-bonder system.

Figure 8F:
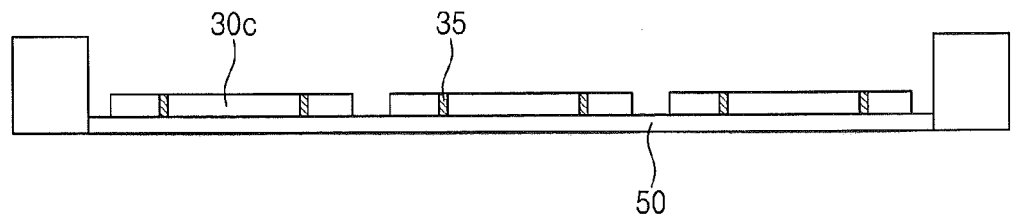

Referring to FIG. 8F, a sawing process may be performed to the wafer 30a to separate the wafer 30a into a plurality of semiconductor chips 30c.

Figure 8G:
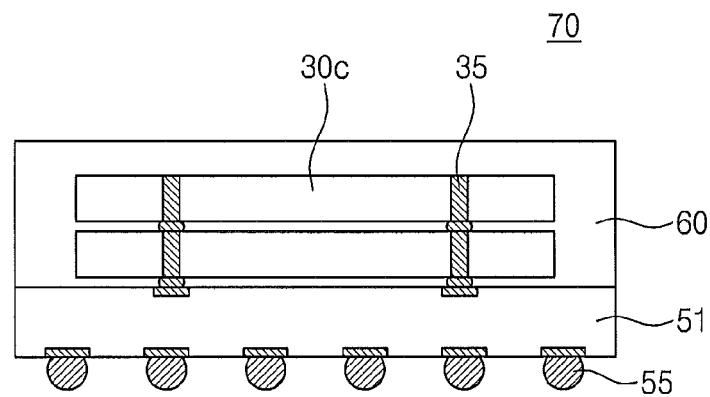

Referring to FIG. 8G, each of the semiconductor chips 30c may be mounted on a package substrate 51 (e.g., printed circuit board (PCB)). Thereafter, a molding process may be performed to form a mold layer 60 covering the semiconductor chip 30c and the package substrate 51. Next, a solder ball 55 may be attached on a bottom surface of the package substrate 51 to form a semiconductor package 70.

According to the afore-described embodiments, the through via 35 is provided in the wafer 30, but example embodiments of the inventive concept may not be limited thereto. For example, the wafer 30 may be configured to not include any through via.

The semiconductor package technology described above may be applied to realize a variety of semiconductor devices and package modules including the same.

Figure 10:
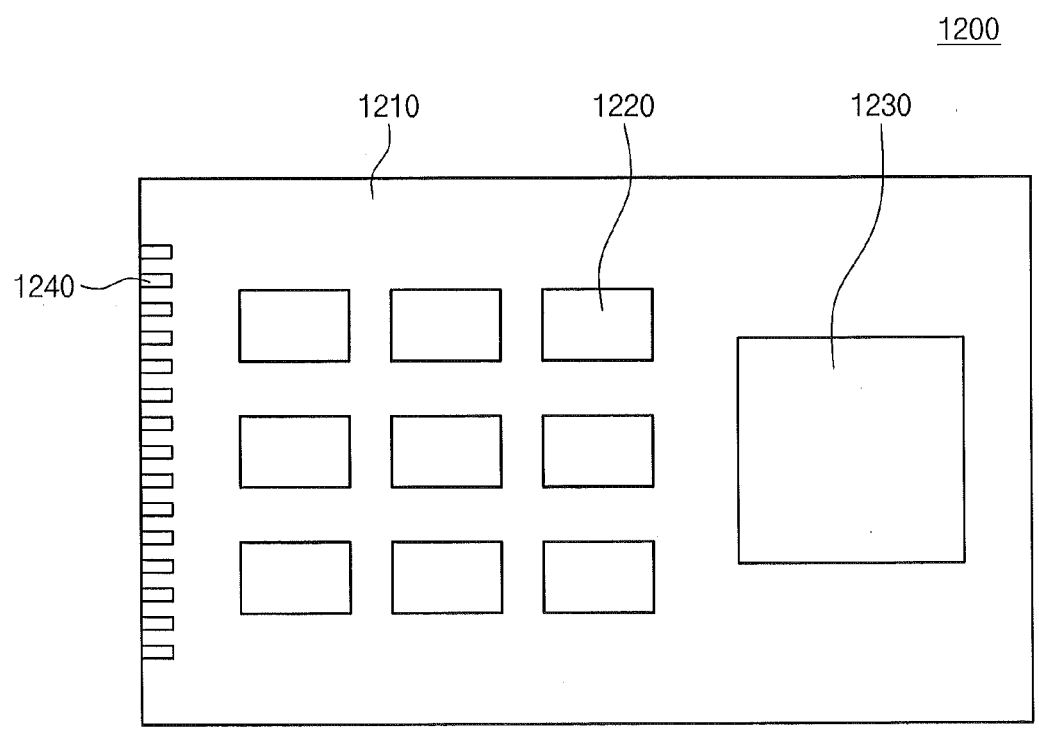
FIG. 10 is a diagram illustrating an example of package modules including semiconductor packages according to example embodiments of the inventive concept.

FIG. 10 is a diagram illustrating an example of package modules including semiconductor packages according to example embodiments of the inventive concept. Referring to FIG. 10, a package module 1200 may include semiconductor devices 1220 and a semiconductor device 1230 packaged in a quad flat package (QFP) type. The semiconductor devices 1220 and 1230 may be formed using a semiconductor package technology according to example embodiments of the inventive concept, and in the package module 1200, the semiconductor devices 1220 and 1230 may be mounted on a semiconductor package substrate 1210. The package module 1200 may be connected to an external electronic device through an external connection terminal 1240 disposed at one side of the package substrate 1210.

Figure 11:
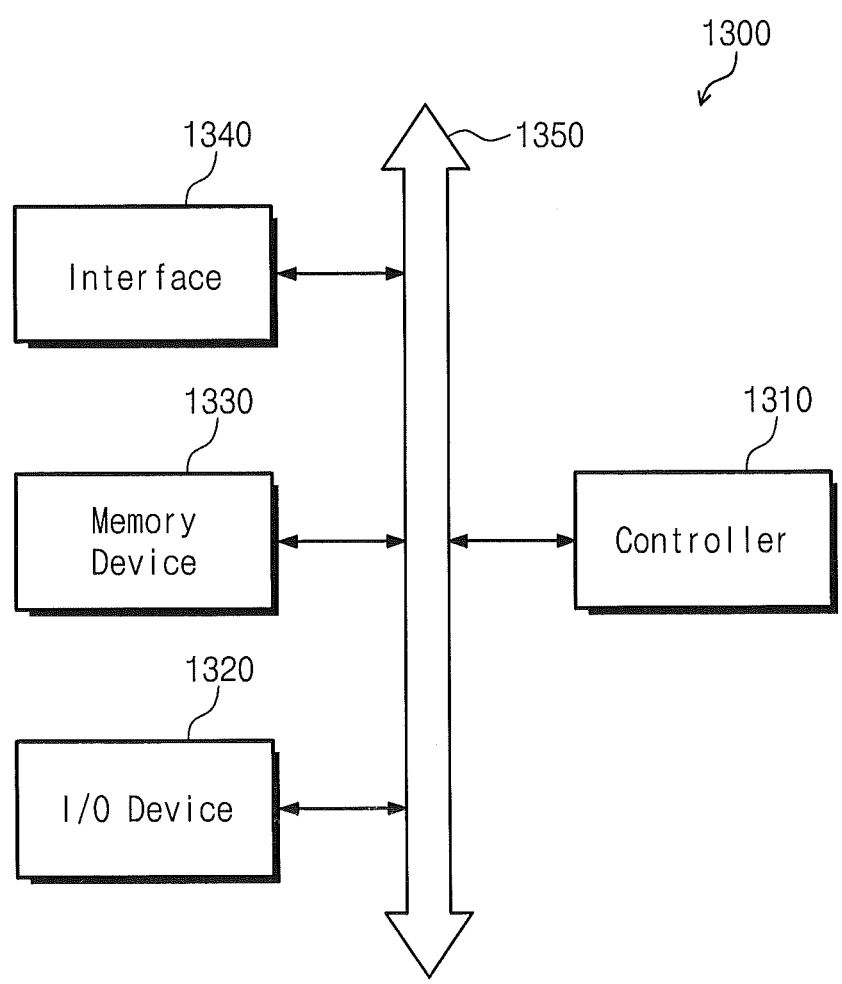
FIG. 11 is a schematic block diagram illustrating an example of electronic systems including semiconductor packages according to example embodiments of the inventive concept.

The semiconductor package technology may be applied to realize electronic systems. FIG. 11 is a schematic block diagram illustrating an example of electronic systems including semiconductor packages according to example embodiments of the inventive concept. Referring to FIG. 11, an electronic system 1300 may include a controller 1310, an input/output (I/O) unit 1320, and a memory device 1330. The controller 1310, the I/O unit 1320 and the memory device 1330 may be combined or communicate with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include the semiconductor package according to example embodiments of the inventive concept. The I/O unit 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as a solid state disk (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate wirelessly or by cable. For example, the interface unit 1340 may include an antenna for wireless communication or a transceiver or connection for cable communication. Although not shown in the drawings, an application chipset and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 12:
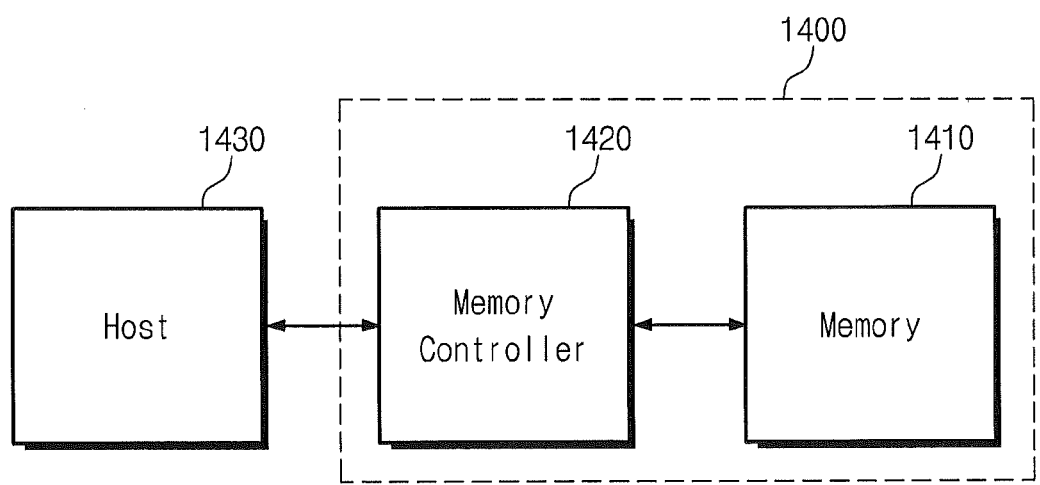
FIG. 12 is a schematic block diagram illustrating an example of memory systems including semiconductor packages according to example embodiments of the inventive concept.

The semiconductor device according to example embodiments of the inventive concept may be provided in a form of a memory card. FIG. 12 is a schematic block diagram illustrating an example of memory systems including semiconductor packages according to example embodiments of the inventive concept. Referring to FIG. 12, a memory system 1400 may include a non-volatile memory device 1410 and a memory controller 1420. The non-volatile memory device 1410 and the memory controller 1420 may store data or read stored data. The non-volatile memory device 1410 may include at least one non-volatile memory device to which the semiconductor package technology according to example embodiments of the inventive concept is applied. The memory controller 1420 may control the non-volatile memory device 1410 in order to read the stored data and/or to store data in response to read/write request of a host 1430.

According to example embodiments of the inventive concept, the carrier may include a recess region provided adjacent to an edge thereof. The recess region may confine the adhesive layer within a desired region including the same, and thus, it is possible to prevent the adhesive layer from overflowing toward the bottom surface of the carrier and thereby to suppress a problem of process facility contamination. Owing to the presence of the recess region, the adhesive layer may be in contact with an edge region of the wafer in a relatively reduced contact area. Accordingly, it is possible to reduce an exposed area of the adhesive layer in the grinding process of thinning the wafer, and this makes it possible to suppress particle contamination from occurring. That is, process failures can be reduced. In addition, the carrier may be recycled.

While example embodiments of the inventive concept have been particularly shown and described, it will be understood by one of ordinary skill in the art that variations in form and detail may be made therein without departing from the spirit and scope of the attached claims.

What is claimed is:

1. A carrier for supporting a wafer having a device region and an edge region with a boundary therebetween using an adhesive layer interposed between the carrier and the wafer, the carrier comprising an edge portion and at least one recess region formed in a top surface of the carrier at the edge portion,
wherein, when the wafer is attached to the carrier by the adhesive layer in a horizontal orientation with the boundary overlying the recess region and spaced apart horizontally from an outer sidewall of the at least one recess region by a first horizontal distance, the at least one recess region is configured to be substantially filled with adhesive from the adhesive layer such that the adhesive layer is in contact with the edge region of the wafer a second horizontal distance that is less than the first horizontal distance.

2. The carrier of claim 1, wherein the at least one recess region comprises a circle-shaped region extending continuously along the edge portion.

3. The carrier of claim 2, wherein a width of the at least one recess region varies along a length or path of the at least one recess region.

4. The carrier of claim 1, wherein the at least one recess region comprises a plurality of concentric circle-shaped regions extending continuously along the edge portion.

5. The carrier of claim 1, wherein the at least one recess region comprises a plurality of depressions formed in the top surface of the carrier, wherein the depressions are spaced apart from one another.

6. The carrier of claim 5, wherein each of the plurality of depressions is shaped like one of characters '+', 'T', 'I' or a quadrangle, when viewed from above the top surface of the carrier.

7. The carrier of claim 5, wherein the depressions are arranged in a ring shape in the top surface of the carrier.

8. The carrier of claim 1, wherein the at least one recess region has an uneven bottom surface.

9. The carrier of claim 1, wherein the carrier is substantially transparent.

10. The carrier of claim 1, further comprising a mask pattern provided on the top surface of the carrier, wherein a sidewall of the mask pattern is aligned with a sidewall of the at least one recess region.

11. The carrier of claim 1, wherein the at least one recess region is spaced apart from an outermost edge of the carrier.

12. The carrier of claim 1, wherein at least one recess region comprises:
a circle-shaped recess formed in the top surface of the carrier that extends continuously along the edge portion; and
a plurality of spaced apart projections in the recess.

13. The carrier of claim 1, wherein the at least one recess region is at an outermost edge of the carrier.

14. The carrier of claim 1, wherein an outermost edge of the carrier is rounded.

15. A carrier for supporting a wafer using an adhesive layer interposed therebetween, the carrier comprising an edge portion and a recess formed in a top surface of the carrier at the edge portion, the recess extending continuously around the edge region,
the carrier in combination with the wafer that is attached to the carrier by the adhesive layer between the top surface of the carrier and the wafer, wherein adhesive from the adhesive layer substantially fills the recess,
wherein the wafer comprises a device region and an edge region that has a thickness that is less than a thickness of the device region, and wherein a boundary between the device region and the edge region overlies the recess with the carrier and the wafer in a horizontal orientation,
wherein the boundary is spaced apart horizontally from an outer sidewall of the recess by a first horizontal distance, and wherein the adhesive layer is in contact with the edge region of the wafer a second horizontal distance that is less than the first horizontal distance.

16. The carrier of claim 15, wherein the recess is spaced apart from an outermost edge of the carrier.

17. The carrier of claim 15, wherein the recess is at an outermost edge of the carrier.

18. The carrier of claim 15, wherein an outermost edge of the carrier is rounded.

19. The carrier of claim 15, further comprising a plurality of spaced apart projections in the recess.

20. A carrier for supporting a wafer using an adhesive layer interposed therebetween, the carrier comprising an edge portion and at least one recess region formed in a top surface of the carrier at the edge portion,
the carrier in combination with the wafer that is attached to the carrier by the adhesive layer between the top surface of the carrier and the wafer, wherein adhesive from the adhesive layer substantially fills the at least one recess region,
wherein the wafer comprises a device region and an edge region that has a thickness that is less than a thickness of the device region, and wherein a boundary between the device region and the edge region overlies the at least one recess region with the carrier and the wafer in a horizontal orientation,
wherein the boundary is spaced apart horizontally from an outer sidewall of the at least one recess region by a first horizontal distance, and wherein the adhesive layer is in contact with the edge region of the wafer a second horizontal distance that is less than the first horizontal distance.

* * * * *